United States Patent
Yang

(10) Patent No.: US 10,840,273 B2
(45) Date of Patent: Nov. 17, 2020

(54) DISPLAY PANEL PREVENTING CHARGE ACCUMULATION IN DISPLAY AREA

(71) Applicant: Wuhan China Star Optoelectronics Technology Co., LTD., Wuhan (CN)

(72) Inventor: Zuyou Yang, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 8 days.

(21) Appl. No.: 16/210,729

(22) Filed: Dec. 5, 2018

(65) Prior Publication Data

US 2019/0305011 A1   Oct. 3, 2019

(30) Foreign Application Priority Data

Mar. 29, 2018   (CN) .......................... 2018 1 0270490

(51) Int. Cl.
*H01L 27/12* (2006.01)
*H01L 27/02* (2006.01)
*G02F 1/1362* (2006.01)

(52) U.S. Cl.
CPC ...... *H01L 27/1244* (2013.01); *H01L 27/0296* (2013.01); *G02F 1/136204* (2013.01)

(58) Field of Classification Search
CPC . H01L 27/1244; H01L 27/0296; H01L 27/12; H01L 27/02; G02F 1/136204; G02F 1/1362
USPC ........................................................ 257/776
See application file for complete search history.

(56) References Cited

U.S. PATENT DOCUMENTS

| | | | | |
|---|---|---|---|---|
| 5,648,858 A | * | 7/1997 | Shibata | G02B 6/0051 349/57 |
| 8,054,304 B2 | * | 11/2011 | Lin | G06F 3/0412 257/87 |
| 8,603,845 B2 | * | 12/2013 | Choi | H01L 27/124 257/E21.409 |
| 9,728,840 B2 | * | 8/2017 | Shi | H01Q 1/243 |
| 2005/0269638 A1 | * | 12/2005 | Jung | G02F 1/1368 257/347 |
| 2006/0157710 A1 | * | 7/2006 | Lee | H01L 27/12 257/72 |
| 2006/0177770 A1 | * | 8/2006 | Kim | H01L 27/12 430/296 |
| 2007/0036387 A1 | * | 2/2007 | Chang | H04R 1/06 381/396 |
| 2007/0252790 A1 | * | 11/2007 | Jung | H01L 27/3276 345/76 |
| 2016/0103368 A1 | * | 4/2016 | Imanishi | G02F 1/133723 349/43 |
| 2016/0322602 A1 | * | 11/2016 | Jung | H01L 29/7869 |
| 2017/0075174 A1 | * | 3/2017 | Lee | G02F 1/133512 |
| 2017/0179160 A1 | * | 6/2017 | Takahashi | H01L 27/1225 |
| 2017/0317104 A1 | * | 11/2017 | Jeong | H01L 27/1288 |

(Continued)

*Primary Examiner* — Alexander O Williams
(74) *Attorney, Agent, or Firm* — Kirton McConkie; Evan R. Witt

(57) ABSTRACT

A display panel is provided and includes a first data line and a first signal line which are disposed at a display area, a second data line and a second signal line which are disposed at a non-display area. A portion of the second data lines, a portion of the second signal lines, and the first data line or the first signal line are all on a same film layer structure of the display panel.

9 Claims, 5 Drawing Sheets

(56) References Cited

U.S. PATENT DOCUMENTS

| | | | | |
|---|---|---|---|---|
| 2018/0061906 A1* | 3/2018 | Kim | .................... | H01L 27/326 |
| 2018/0181240 A1* | 6/2018 | Heo | .................. | H01L 51/5284 |
| 2019/0041915 A1* | 2/2019 | Park | ................ | G02F 1/133305 |
| 2019/0067402 A1* | 2/2019 | Cho | .................. | H01L 27/1248 |
| 2019/0273125 A1* | 9/2019 | Takechi | ............ | H01L 51/5228 |
| 2019/0302959 A1* | 10/2019 | Clark | .................. | G06F 3/0443 |
| 2019/0312099 A1* | 10/2019 | Matsueda | ........... | G09G 3/3233 |
| 2019/0341002 A1* | 11/2019 | Kimura | ............... | G09G 3/2003 |
| 2019/0391691 A1* | 12/2019 | Zhou | .................. | H01L 27/3276 |
| 2020/0203390 A1* | 6/2020 | Kim | .................. | G02F 1/13458 |

\* cited by examiner

DISPLAY PANEL PREVENTING CHARGE ACCUMULATION IN DISPLAY AREA

FIELD OF THE INVENTION

The present invention relates to the field of flat panel displays, and particularly to display devices.

BACKGROUND OF THE INVENTION

Liquid crystal displays (LCD) are widely used flat panel displays which accomplish image display primarily by adjusting light field intensities of backlight sources via liquid crystal switches. An LCD display device comprises a thin film transistor (TFT). And TFT-LCDs are thin film transistor liquid crystal displays. Every liquid crystal pixel point disposing on this type of display is driven by a thin film transistor which is integrated behind the liquid crystal pixel point. Therefore, TFT-LCDs possess fast response speeds, high brightness, high contrast ratio, small size, low power consumption, free of radiation, etc. TFT-LCDs occupies a dominant position in current display markets.

TFT-LCDs can be categorized into polycrystalline silicon (poly-Si TFT) and amorphous silicon (a-Si TFT). One difference between both the polycrystalline silicon (poly-Si TFT) and the amorphous silicon is that transistor characteristics are different. Arrangement state of the molecular structure of the polycrystalline silicon inside a grain is aligned regular and directional; therefore, its electron mobility is 200-300 times faster than electron mobility of the amorphous silicon which is irregularly aligned. In general, the term TFT-LCD refers to amorphous silicon. Technology of the amorphous silicon is mature and it is a mainstream product of the LCD. Polycrystalline silicon products mainly comprise high-temperature polycrystalline silicon (HTPS) and low-temperature polycrystalline silicon (LTPS) products.

At present, display areas of conventional LTPS and a-Si TFT display panels do not have any protective electrostatic discharge design. As shown in FIG. 1 and FIG. 2, a conventional LTPS display panel comprises a display area 10 and a non-display area 20. The display area 10 comprises a plurality of gate lines 101, a plurality of data lines 102, and a pixel 103 which is formed by the surrounding gate lines 101 and data lines 102; the non-display area 20 comprises a dummy gate line 104, a dummy data line 105, and a dummy pixel 106 which is formed by the surrounding dummy gate line 104, the dummy data lines 105, and the gate lines 101. In the non-display area 20, the dummy gate line 104 and the dummy data line 105 form a loop which results in a large amount of charge accumulation and abnormalities in display area 10 and thus, affecting yield of the display panel. In addition, the connection of the dummy gate lines 104 and the data lines 102, or the dummy data lines 105 and the gate lines 101 cause short circuiting of the loop and affects normal display of the display panel.

SUMMARY OF THE INVENTION

The invention provides a display panel in order to solve the problem of discharging static electricity due to charge accumulation in the display area of the existing display panel.

In order to solve the above-mentioned problems, the technical schemes provided by the present disclosure are as follows:

A display panel is provided by the present disclosure, comprising: a plurality of data lines and a plurality of signal lines, wherein the data lines comprise a first data line and a second data line, the signal lines comprise a first signal line and a second signal line, the first data line and the first signal line are disposed in a display area of the display panel, the second data line and the second signal line are disposed in a non-display area of the display panel; and wherein a portion of the second data line, a portion of the second signal line, and the first data line or the first signal line are all on a same film layer structure of the display panel.

According to a preferred embodiment of the present disclosure, the signal lines and the second data line are perpendicular to each other but do not intersect, and a first passivation layer is disposed at a crossover point where the signal lines extend across the second data line.

According to a preferred embodiment of the present disclosure, the second data line comprises a first portion of the second data line and a second portion of the second data line, the first portion of the second data line, the second signal line, and the first signal line are made of a first metal layer, the second portion of the second data line and the first data line are made of a second metal layer; and wherein the first portion of the second data line and the second portion of the second data line are connected together via a first through hole.

According to a preferred embodiment of the present disclosure, the second portion of the second data line is formed on or under the crossover point where the signal lines extend across the second data line.

According to a preferred embodiment of the present disclosure, the signal lines comprise a first portion of the signal lines and a second portion of the signal lines, the first portion of the signal lines and the second data line are made of a first metal layer, the second portion of the signal line and the first data line are made of a second metal layer; and wherein the first portion of the signal lines and the second portion of the signal lines are connected together via a second through hole.

According to a preferred embodiment of the present disclosure, the data lines and the second signal line are perpendicular to each other but do not intersect, and a second passivation layer is disposed at a crossover point where the data line extends across the second signal line.

According to a preferred embodiment of the present disclosure, the second signal line comprises a first portion of the second signal line and a second portion of the second signal line, the first portion of the second signal line, the second data line and the first data line are made of a second metal layer, the second portion of the second signal line and the first signal line are made of a first metal layer; and wherein the first portion of the second signal line and the second portion of the second signal line are connected together via a third through hole.

According to a preferred embodiment of the present disclosure, the second portion of the second signal line is formed on or under the crossover point where the data line extends across the second signal line.

According to a preferred embodiment of the present disclosure, the data lines comprise a first portion of the data lines and a second portion of the data lines, the first portion of the data lines and the second signal line are made of a second metal layer, the second portion of the data lines and the first signal line are made of a first metal layer; and wherein the first portion of the data line and the second portion of the data line are connected together via a fourth through hole.

According to a preferred embodiment of the present disclosure, the second signal line and the second data line form a loop in the non-display area of the display panel, and an end of the loop is connected to a ground wire.

Benefits of the present disclosure: a display panel is provided by the present disclosure. A portion of the second data lines, a portion of the second signal lines, and the first data line or the first signal line are all on a same film layer structure of the display panel. By disposing an insulating layer on or under a crossover point where the signal lines extend across the second data line, or a crossover point where the data line extends across the second signal line, the short circuit caused by connection of the signal line and the second data line or connection of the data line and the second signal line is avoided and thus preventing the display panel from abnormal display. Moreover, a circular loop formed by the first data line and the second data line is connected with a ground wire, so that peripheral discharges of the display area enter the ground wire, thus avoiding discharge of charges and improving display panel yield.

DESCRIPTION OF THE DRAWINGS

In order to illustrate a technical solution in the embodiments or in the prior art more clearly, the accompanying drawings required in the description of the embodiments or the prior art are introduced briefly hereafter. It is obvious that the accompanying drawings in the following description are merely part of the embodiments of the present invention. People with ordinary skills in the art can obtain other drawings without making inventive efforts.

DETAILED DESCRIPTION OF THE PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

Figure 1:
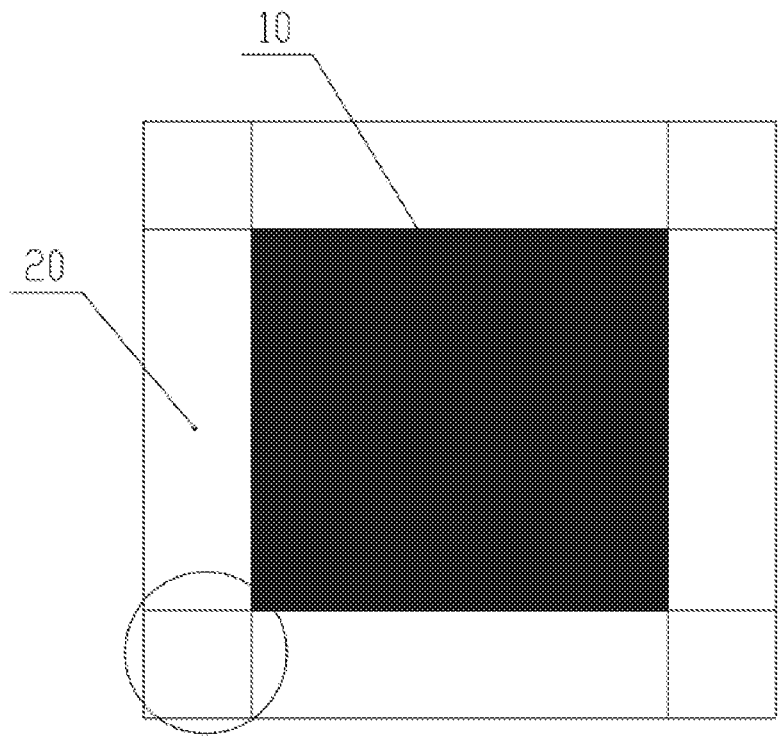
FIG. 1 is a structural diagram of a display panel in the prior art.
Figure 2:
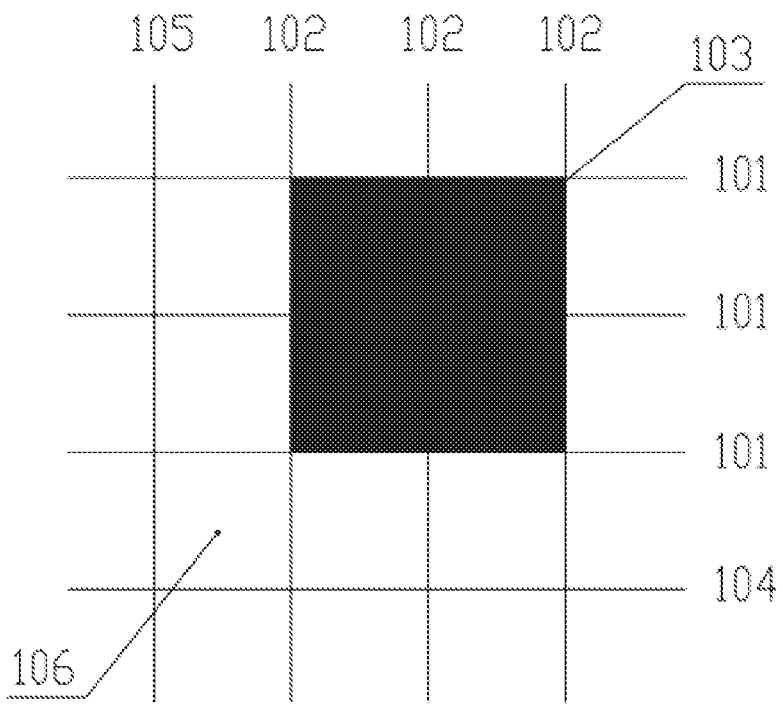
FIG. 2 is a circuit diagram of a non-display area of a display panel in the prior art.

The present disclosure proposes a structure diagram of a display panel, as shown in FIG. 1, the display panel comprises a display area 10 and a non-display area. The non-display area 20 is formed outside the display panel and the non-display area 20 surrounds the display area 10.

The display panel comprises a plurality of data lines 208 and a plurality of signal lines 207, wherein the data lines comprises a plurality of first data lines 202 and a second data line 205, the signal line comprises a plurality of first signal lines 201 and a second signal line 204, the first data line 202 and the first signal line 201 are disposed in the display area of the display panel, the second data line 205 and the second signal line 204 are disposed in a non-display area of the display panel.

The display area 10 comprises a plurality of first type of pixel 203 having a thin film transistor, the first type of pixel 203 is any one of a red sub-pixel, a green sub-pixel, and blue sub-pixel. Each of the first type of pixel 203 is surrounded by two parallel first signal lines 201 and two parallel first data lines 202. The first signal line 201 and the first data line 202 are perpendicular to each other. The first signal line 201 and the first data line 202 are on the different film structure structures of the display panel. In a preferred embodiment of the present invention, the first signal line 201 is a gate line of the thin film transistor, and the first data line 202 is a data line of the thin film transistor.

Figure 3:
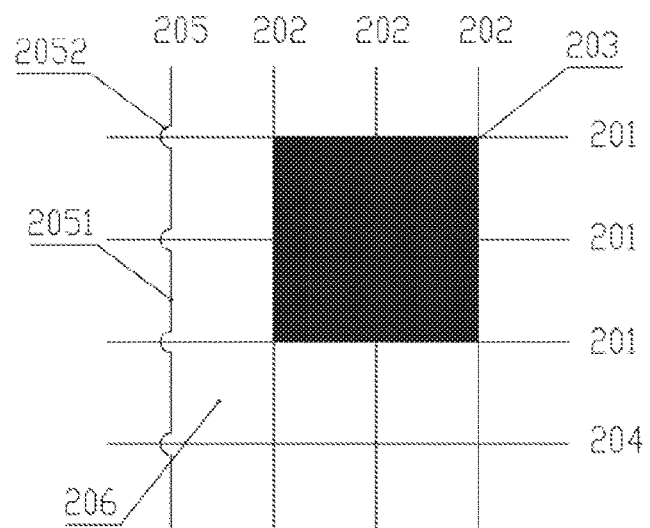
FIG. 3 is a circuit diagram of a layout of a display panel according to the preferred embodiment I of the present invention.

The non-display area 20 comprises a second type of pixel 206, as shown in FIG. 3. Each of the second type of pixel 206 is surrounded by a second signal line 204 and a second data line 205, or a first data line 202 and a second signal line 204, or a first signal line 201 and a second data line 205.

Embodiment I

The second data line 205 comprises a first portion of the second data line 2051 and a second portion of the second data line 2052. The first portion of the second data line 2051, the second signal line 204, and the first signal line 201 are made of a first metal layer. The second portion of the second data line 2052 and the first data line 202 are made of a second metal layer. The first signal line 201 and the second data line 205 are perpendicular to each other but do not intersect. The second type of pixel 206 is preferably a dummy pixel, the second signal line 204 is a dummy gate line, and the second data line 205 is a dummy data line.

In the present embodiment, the arrangement of the second type of pixel 206, i.e., the dummy pixel region, is for preventing the display area of the display panel from being affected by influence generated by the structural changes and electromagnetic changes which are caused by the periphery of the display area of the display panel; therefore, the dummy pixels are disposed in the periphery of the display area.

According to a preferred embodiment of the present invention, as shown in FIG. 3, the first signal line 201 is made of a first metal layer, i.e., forming a gate layer of the thin film transistor. The first data line 202 is made of a second metal layer, i.e., forming a source and drain electrode layer of the thin film transistor; the second signal line 204 and the first portion of the second data line 2051 are made of the first metal layer which forms a dummy gate line and a dummy data line, i.e., the dummy gate line, the dummy data line, and the gate layer of the thin film transistor are made of a same layer of metal using a same photomask in a manufacturing process.

Wherein the first metal layer and the second metal layer can be deposited by utilizing a magnetron sputtering process. A first metal layer thin film is deposited. In general, the metal material can employ one of molybdenum, aluminum and aluminum-nickel alloy, molybdenum, tungsten alloy, chromium, copper or other metals. A combination structure of the above-mentioned materials can also be employed. The raw materials of the first metal layer and the second metal layer can be the same or different.

Figure 4:
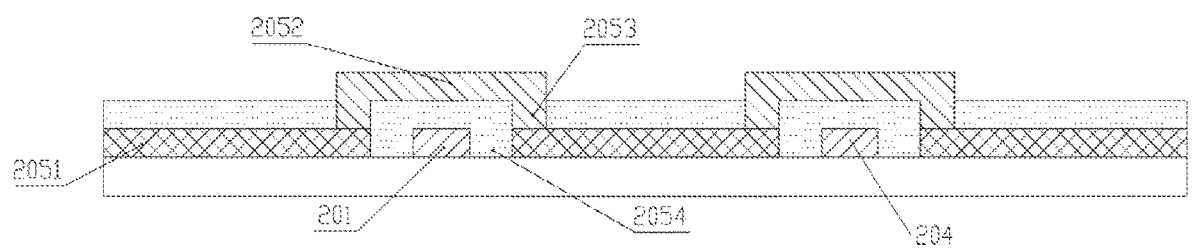
FIG. 4 is a structural diagram of a film layer of a certain cross section of a display panel according to a preferred embodiment I of the present invention.

In addition, the second portion of the second data line 2052 is positioned between the first signal line 201 and the second data line 205, or on or under the crossover point where the second data line 205 extends across the second signal line 204. As is shown in FIG. 4, in the present embodiment, the crossover point employs a crossover wiring design, i.e., the second portion of the second data line 2052 and the first portion of the second data line 2051 are different film layers. The first signal line 201 or the second the signal line 204 is preferably disposed under the second portion of the second data line 2052.

The crossover wiring design, i.e., the second portion of the second data line 2052 is made of a second metal layer and is connected with the first portion of the second data line 2051 via a first through hole 2053, such that the gate line is not connected with the dummy data line and preventing the gate line and the dummy data line from being directly connected which results in a short circuit in the loop and leading to abnormalities in display screens.

A first passivation layer 2054 is disposed between the first signal line 201 and the second portion of the second data line 2052. The first passivation layer 2054 is preferably made of insulation material. In the present embodiment, the first passivation layer which is disposed between the first signal line 201 and the second data line 2052 can be one of a first insulating layer, a first semiconductor layer, or one or more than one of the combinations thereof.

In addition, an end of the loop which is formed by the second signal line 204 and the second data line 205 is connected to a ground wire, so that charges of the periphery of the display area enter the ground wire and thus avoiding discharge of charges and improving yield of the display panel.

Embodiment II

Figure 5:
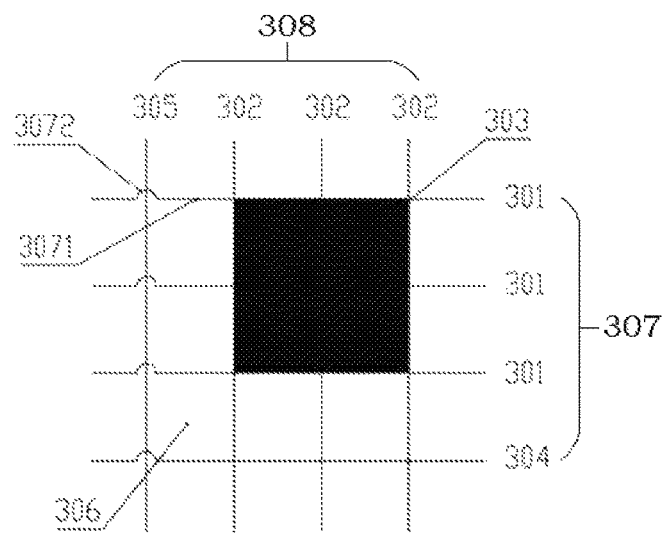
FIG. 5 is a circuit diagram of a layout of a display panel according to a preferred embodiment II of the present invention.
Figure 6:
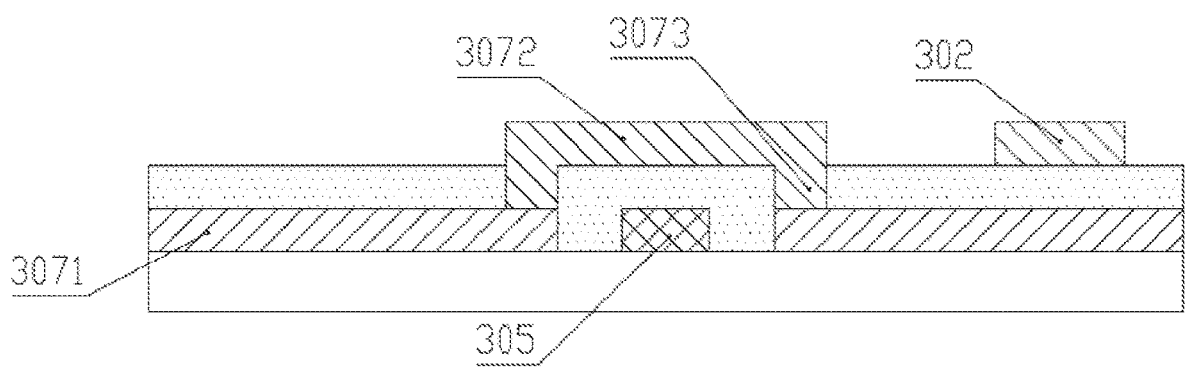
FIG. 6 is a structural diagram of a film layer of a certain cross section of a display panel according to the preferred embodiment II of the present invention.

The embodiment is the same as or similar to the specific embodiment I, and the differences therebetween is that:

As shown in FIG. 5 and FIG. 6, the signal line 307 comprises a first portion of the signal line 3071 and a second portion of the signal line 3072, wherein the first portion of the signal line 3071 and the second data line 305 are made of the first metal layer, the second portion of the signal line 3072 and the first data line 302 are made of a second metal layer. In addition, the first portion of the signal line 3071 and the second portion of the signal line 3072 are connected via the second through hole 3073; A passivation layer is disposed at a crossover point where the signal line extends across the second data line 305. The structure of the passivation layer is the same as the structure of the passivation layer of the specific embodiment I.

Similar to the embodiment I, the present embodiment employs a crossover wiring design. However, the position of the crossover wiring is a crossover point where each signal line 307 extends across the second data line 305, i.e., each of the signal lines 307 is changed which is contrary to the embodiment I which only one second data line 305 is changed, i.e., a plurality of crossover wiring designs are employed on the same second data line 305.

Embodiment III

Figure 7:
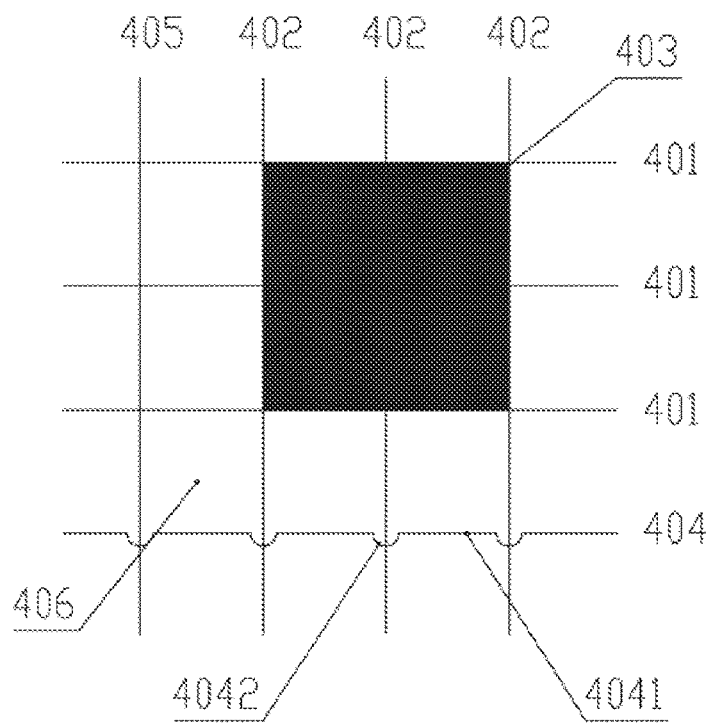
FIG. 7 is a circuit diagram of a layout of a display panel according to a preferred embodiment III of the present invention.

A circuit diagram of a non-display area of a display panel provided in a preferred embodiment II of the present invention, as shown in FIG. 7. The second signal line 404 comprises a first portion of the second signal line 4041 and a second portion of the second signal line 4042. The first portion of the second signal line 4041, the second data line 405, and the first data line 402 are made of a second metal layer. The second signal line 4042 and the first signal line 401 are made of a first metal layer. The first data line 402 and the second signal line 404 are perpendicular to each other but do not intersect.

The first signal line 401 forms a gate layer of the thin film transistor. The first data line 402 forms a source and drain electrode layer of the thin film transistor.

The second signal line 404 and the second data line 405 respectively form a dummy gate line and a dummy data line of the display panel, i.e., the dummy gate line, the dummy data line, and the source and drain electrode layer of the thin film transistor are made of a same layer of metal using a same photomask in a manufacturing process. The selection of the materials of the first metal layer and the second metal layer are the same as the selection of the materials of the first metal layer and the second metal layer in the specific embodiment I which is not repeated herein.

In addition, the second portion of the second signal line 4042 is disposed on or under a crossover point where the first data line 402 extends across the second signal line 404, or where the second signal line 404 extends across the second data line 405. As shown in FIG. 6, the crossover point employs a crossover wiring design, i.e., the second portion of the second signal line 4042 and the first portion of the second signal line 4041 are different film layers. The first data line 402 or the second data line 405 is preferably disposed on the second portion of the second signal line 4042.

The crossover wiring design, i.e., the second portion of the second signal line 4042 is made of a second metal layer and is connected with the first portion of the second signal line 4041 via a third through hole 4043, such that the gate line is not connected with the dummy data line and preventing the gate line and the dummy data line from being directly connected which results in a short circuit in the loop and leading to abnormalities in display screens.

A second passivation layer 4044 is disposed between the first data line 402 and the second portion of the second signal line 4042. The second passivation layer 4044 is preferably made of an insulation material. In the present embodiment, the second passivation layer which disposed between the first data line 402 and the second portion of the second signal line 4042 can be one of a second insulating layer, a second semiconductor layer, or one or more than one of the combinations thereof.

In addition, an end of the loop which is formed by the second signal line 404 and the second data line 405 is connected to a ground wire, so that charges of the periphery of the display area enter the ground wire and thus avoiding discharge of charges and improving the display panel yield.

Embodiment IV

Figure 8:
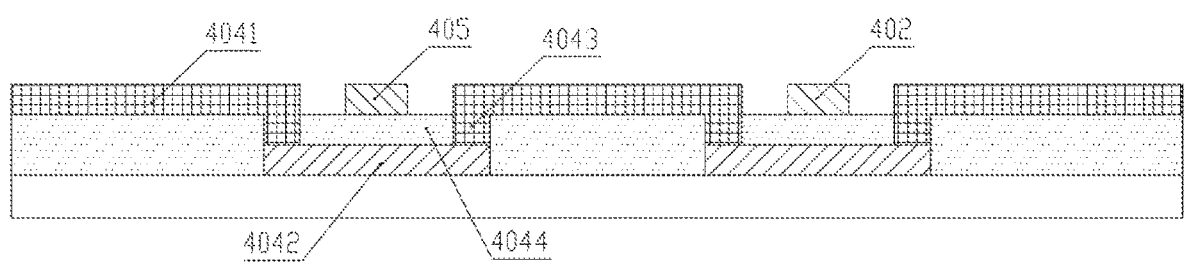
FIG. 8 is a structural diagram of a film layer of a certain cross section of a display panel according to a preferred embodiment III of the present invention.
Figure 9:
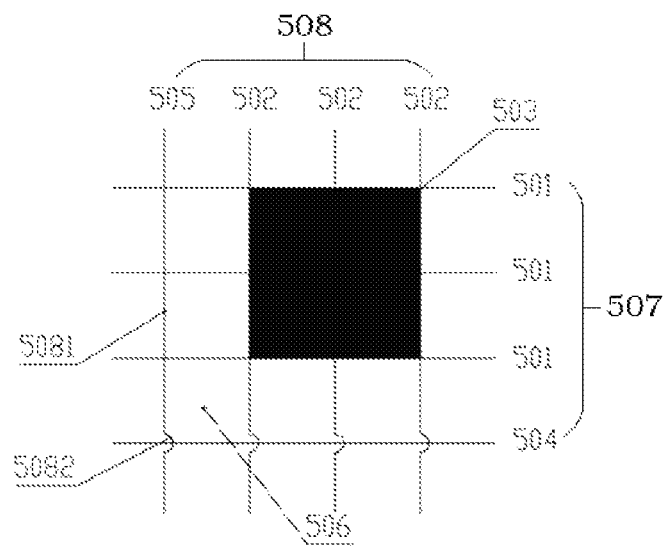
FIG. 9 is a circuit diagram of a layout of a display panel according to a preferred embodiment IV of the present invention.
Figure 10:
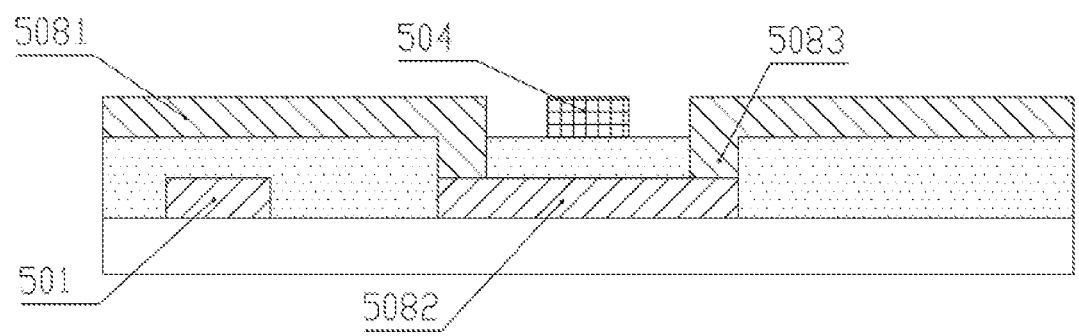
FIG. 10 is a structural diagram of a film layer of a certain cross section of a display panel according to the preferred embodiment IV of the present invention.

The embodiment is the same as or similar to the specific embodiment III, and the differences therebetween is that:

As shown in FIG. 7 and FIG. 8, the data line 508 comprises a first portion of the data line 5081 and a second portion of the data line 5082. The first portion of the data line 5081 and the second signal line 504 are made of a second metal layer. The second portion of the data line 5082 and the first signal line 501 are made of a first metal layer. The first portion of the data line 5081 and the second portion of the data line 5082 are connected via a fourth through hole 5083. A passivation layer is disposed at a crossover point where the data line 508 extends across the second signal line 504. The structure of the passivation layer is the same as the passivation layer of the specific embodiment III.

Similar to the specific embodiment, the present embodiment employs a crossover wiring design. However, the position of the crossover wiring is a crossover point where each data line 508 extends across the second signal line 504, i.e., each of the data lines is changed which is contrary to the embodiment III which only one second data line 504 is changed, i.e., a plurality of crossover wiring designs are employed on the same second data line 504.

The present disclosure provides a display panel, comprising: a first data line and a first signal line which are disposed at a display area, a second data line and a second signal line which are disposed at a non-display area. A portion of the second data lines, a portion of the second signal lines, and the first data line or the first signal line of the present disclosure are all on a same film layer structure of the display panel. By disposing an insulating layer on or under a crossover point where the signal lines extend across the second data line, or a crossover point where the data line extends across the second signal line, the short circuit caused by connection of the signal line and the second data line or connection of the data line and the second signal line is avoided and thus preventing the display panel from abnormal display. Moreover, a circular loop formed by the first data line and the second data line is connected with a ground wire, so that peripheral discharges of the display area enter the ground wire, thus avoiding discharge of charges and improving display panel yield.

In summary, although the present invention has been described with preferred embodiments thereof, the above preferred embodiments is not used to limit the present invention. One of ordinarily skill in the art can carry out changes and modifications to the described embodiment without departing from the scope and the spirit of the invention that is intended to be limited only by the appended claims.

The invention claimed is:

1. A display panel, comprising:
a plurality of data lines and a plurality of signal lines, wherein the data lines comprise a first data line and a second data line, the signal lines comprise a first signal line and a second signal line, the first data line and the first signal line are disposed in a display area of the display panel, the second data line and the second signal line are disposed in a non-display area of the display panel; and
wherein the second data line comprises a first portion of the second data line and a second portion of the second data line,
wherein the first portion of the second data line, the second signal line, and the first signal line are all on a same film layer structure of the display panel;
the second portion of the second data line is formed on a passivation layer disposed at a crossover point where the signal lines extend across the second data line,
the first portion of the second data line and the signal lines are formed under the passivation layer,
and the first portion of the second data line and the second portion of the second data line are connected together via a first through hole penetrating through the passivation layer.

2. The display panel according to claim 1, wherein the signal lines and the second data line are perpendicular to each other but do not intersect each other.

3. The display panel according to claim 1, wherein the first portion of the second data line, the second signal line, and the first signal line are made of a first metal layer, the second portion of the second data line and the first data line are made of a second metal layer.

4. A display panel, comprising:
a plurality of data lines and a plurality of signal lines, wherein the data lines comprise a first data line and a second data line, the signal lines comprise a first signal line and a second signal line, the first data line and the first signal line are disposed in a display area of the display panel, the second data line and the second signal line are disposed in a non-display area of the display panel; and
wherein the signal lines comprise a first portion of the signal lines and a second portion of the signal lines,
wherein the second data line, a first portion of the second signal line, and a first portion of the first signal line are all on a same film layer structure of the display panel;
the second portion of the signal lines is formed on a passivation layer disposed at a crossover point where the signal lines extend across the second data line, the first portion of the signal lines and the second data line are formed under the passivation layer,
and the first portion of the signal lines and the second portion of the signal lines are connected together via a second through hole penetrating through the passivation layer.

5. The display panel according to claim 4, wherein the signal lines and the second data line are perpendicular to each other, but do not intersect each other.

6. The display panel according to claim 4, wherein the first portion of the signal lines and the second data line are made of a first metal layer, the second portion of the signal lines and the first data line are made of a second metal layer.

7. A display panel, comprising:
a plurality of data lines and a plurality of signal lines, wherein the data lines comprise a first data line and a second data line, the signal lines comprise a first signal line and a second signal line, the first data line and the first signal line are disposed in a display area of the display panel, the second data line and the second signal line are disposed in a non-display area of the display panel; and
wherein the data lines comprise a first portion of the data lines and a second portion of the data lines,
wherein the first portion of the second data line, the second signal line, and the first portion of the first data line are all on a same film layer structure of the display panel;
the second portion of the data lines is formed under a passivation layer disposed at a crossover point where the second signal line extends across the data lines, the first portion of the data lines and the second signal line are formed on the passivation layer, and the first portion of the data lines and the second portion of the data lines are connected together via a fourth through hole penetrating through the passivation layer.

8. The display panel according to claim 7, wherein the second signal line and the data lines are perpendicular to each other but do not intersect each other.

9. The display panel according to claim 7, wherein the first portion of the data lines and the second signal line are made of a second metal layer, the second portion of the data lines and the first signal line are made of a first metal layer.

* * * * *